United States Patent
Neul et al.

(10) Patent No.: US 8,950,258 B2
(45) Date of Patent: Feb. 10, 2015

(54) MICROMECHANICAL ANGULAR ACCELERATION SENSOR AND METHOD FOR MEASURING AN ANGULAR ACCELERATION

(75) Inventors: Reinhard Neul, Stuttgart (DE); Torsten Ohms, Vaihingen/Enz-Aurich (DE); Mirko Hattass, Stuttgart (DE); Daniel Christoph Meisel, Vaihingen an der Enz (DE)

(73) Assignee: Robert Bosch GmbH, Stuttgart (DE)

( * ) Notice: Subject to any disclaimer, the term of this patent is extended or adjusted under 35 U.S.C. 154(b) by 293 days.

(21) Appl. No.: 13/479,746

(22) Filed: May 24, 2012

(65) Prior Publication Data
US 2012/0297878 A1    Nov. 29, 2012

(30) Foreign Application Priority Data

May 24, 2011 (DE) .......................... 10 2011 076 393

(51) Int. Cl.
*G01P 15/10* (2006.01)
*G01P 15/12* (2006.01)
*G01P 15/09* (2006.01)
*H01L 41/113* (2006.01)

(52) U.S. Cl.
CPC ......... *G01P 15/0922* (2013.01); *H01L 41/1132* (2013.01)
USPC .................. 73/514.02; 73/514.38; 73/514.33

(58) Field of Classification Search
CPC . G01P 15/0888; G01P 15/0802; G01P 15/11; G01P 15/18; G01P 15/123; G01P 15/12; G01P 15/0922; G01P 15/0907; G01P 15/097
USPC ............... 73/514.02, 514.33, 514.34, 514.36, 73/514.38, 514.01
See application file for complete search history.

(56) References Cited

U.S. PATENT DOCUMENTS

| | | | | |
|---|---|---|---|---|
| 4,611,490 A | * | 9/1986 | Takeuchi | 73/503 |
| 4,996,878 A | | 3/1991 | Kübler | |
| 5,081,867 A | * | 1/1992 | Yamada | 73/514.33 |
| 5,226,321 A | * | 7/1993 | Varnham et al. | 73/514.02 |
| 5,233,213 A | * | 8/1993 | Marek | 257/415 |
| 5,249,465 A | * | 10/1993 | Bennett et al. | 73/510 |
| 5,349,858 A | * | 9/1994 | Yagi et al. | 73/514.02 |

(Continued)

FOREIGN PATENT DOCUMENTS

| | | |
|---|---|---|
| GB | 1344811 | 1/1974 |
| JP | 2008-107257 A | 5/2008 |
| WO | 2009/109969 A2 | 9/2009 |

OTHER PUBLICATIONS

Furukawa et al., A Structure of Angular Accereleration Sensor Using Silicon Cantilevered Beam with Piezoresistors, IEEE Conference on Industrial Electronics and Control, Instrumentation, and Automation, 1992, pp. 1524-1529.

*Primary Examiner* — Helen Kwok
(74) *Attorney, Agent, or Firm* — Maginot, Moore & Beck LLP

(57) ABSTRACT

A micromechanical angular acceleration sensor for measuring an angular acceleration is disclosed. The sensor includes a substrate, a seismic mass, at least one suspension, which fixes the seismic mass to the substrate in a deflectable manner, and at least one piezoresistive and/or piezoelectric element for measuring the angular acceleration. The piezoresistive and/or piezoelectric element is arranged in a cutout of the seismic mass. A corresponding method and uses of the sensor are also disclosed.

19 Claims, 2 Drawing Sheets

(56) References Cited

U.S. PATENT DOCUMENTS

| | | | |
|---|---|---|---|
| 5,574,221 A * | 11/1996 | Park et al. | 73/514.02 |
| 5,798,460 A * | 8/1998 | Nakagawa et al. | 73/654 |
| 6,370,954 B1 * | 4/2002 | Zerbini et al. | 73/514.01 |
| 7,565,840 B2 * | 7/2009 | Watanabe | 73/514.29 |
| 7,650,787 B2 * | 1/2010 | Ino | 73/514.33 |
| 8,468,888 B2 * | 6/2013 | Wu et al. | 73/514.32 |
| 2010/0058861 A1 * | 3/2010 | Kuang et al. | 73/504.12 |

* cited by examiner

MICROMECHANICAL ANGULAR ACCELERATION SENSOR AND METHOD FOR MEASURING AN ANGULAR ACCELERATION

This application claims priority under 35 U.S.C. §119 to patent application no. DE 10 2011 076 393.7, filed on May 24, 2011 in Germany, the disclosure of which is incorporated herein by reference in its entirety.

The disclosure relates to a micromechanical angular acceleration sensor for measuring an angular acceleration, a method for measuring an angular acceleration, and a use of an angular acceleration sensor.

BACKGROUND

Angular acceleration sensors are used in diverse fields of technology. They can be used in electric tools, for example, and make it possible to monitor an angular acceleration limit for the electric tool, for example a drill. If an overshoot is detected, the electric tool is then switched off. Moreover, angular acceleration sensors are for example also used in the field of video cameras for the purpose of vibration stabilization.

In this case, angular acceleration sensors can be based on the principle that a seismic mass is deflected on account of the angular acceleration and the deflection of the seismic mass is measured. An angular acceleration acting on the seismic mass can then be deduced on the basis of the measured deflection of the seismic mass.

In order to detect a deflection, piezoresistive elements, for example, can be arranged, which are expanded or compressed during a deflection. The piezoresistive elements change their resistance in this case. An angular acceleration acting on the seismic mass can then be deduced on account of the change in the resistance of the piezoresistive elements.

One method for producing a piezoresistive angular acceleration sensor was disclosed for example in the report "A structure of angular acceleration sensor using silicon cantilevered beam with piezoresistors", IEEE Conference on Industrial Electronics, Control, Instrumentation, and Automation, 1992.

U.S. Pat. No. 4,996,878 A disclosed a transducer element for measuring linear and angular accelerations. For this purpose, the transducer element comprises two electro-mechanically acting oscillating beams fixed with respect to a predetermined main axis on a substrate by means of fixing elements. Electrical output signals proportional to a flexure of the beams upon rotation about the main axis are fed to a signal processing circuit, which is designed such that, with identical or opposite polarity of the oscillating beams, a summing amplifier determines the linear acceleration along the z-axis and a differential amplifier determines the angular acceleration about the y-axis. The oscillating beams can be embodied as piezoelectric bending elements or as bending elements coated with piezoresistive semiconductors.

A further angular acceleration sensor was disclosed in GB 1,344,811 A. In this case, the angular acceleration sensor comprises an annular conduit with an electrically non-conductive fluid, at least one barrier in said conduit, such that at least two ends are provided for said conduit, a pair of electrical or piezoresistive elements for each conduit end, wherein one is respectively arranged adjacent to said conduit ends and wherein said elements are arranged in the conduit in this way in order to be subjected to pressure changes in said fluid. The angular acceleration can then be deduced from the pressure changes by means of the resistance changes.

WO 09109969 A disclosed an angular rate sensor device. The angular rate sensor device in this case comprises a disk-shaped structure having a region for a seismic mass and a flexible region. The disk-shaped structure is connected to a substrate in a manner enabling a wave-type precession motion and such that during the wave-type precession motion the material of the seismic mass performs elliptic motion.

JP 2008/107257 A disclosed an acceleration sensor for measuring a linear acceleration and an angular acceleration. The sensor substantially comprises a rectangular frame, in the center of which a seismic mass is arranged. The seismic mass is connected to the rectangular frame by means of beams running perpendicularly to the respective sides. In the end region of two beams arranged on the frame, two piezoresistive elements for measuring the angular acceleration are arranged in each case obliquely with respect to one another.

SUMMARY

A first aspect of the disclosure relates to a micromechanical angular acceleration sensor for measuring an angular acceleration, comprising a substrate, a seismic mass, at least one suspension, which fixes the seismic mass to the substrate in a deflectable manner, and at least one piezoresistive and/or piezoelectric element for measuring the angular acceleration, wherein the piezoresistive and/or piezoelectric element is arranged in a cutout of the seismic mass.

A second aspect of the disclosure relates to a method for measuring an angular acceleration, more particularly suitable for being carried out by an angular acceleration sensor, comprising the steps of:

subjecting a seismic mass to a force on account of an angular acceleration, and measuring a deflection of the seismic mass on account of the force, wherein the deflection is measured by means of at least one piezoresistive and/or piezoelectric element, and wherein the piezoresistive and/or piezoelectric element is arranged in a cutout of the seismic mass.

Another aspect of the disclosure relates to a use of an angular acceleration sensor in motor vehicles for detecting a motor vehicle roll-over and/or in mobile devices as means of a human-machine interface.

Yet another aspect of the disclosure relates to a use of an angular acceleration sensor for positioning a write/read head of a mass storage device, more particularly of a hard disk, of a computer.

In this case, the piezoresistive element can be embodied in the form of silicon beams, nanowires and/or carbon nanotubes, and/or comprise silicon carbide and/or a polymer. The piezoresistive element can likewise be embodied as an applied metal thin film and/or in the form of material diffused into a carrier. Finally, the piezoresistive element can also be constructed in two-layered fashion, comprising a first, insulating layer, for example composed of silicon oxide, and a second layer in the form of a metal thin film as a strain gauge.

The advantage achieved by the features set in the disclosure is that the area requirement of a micromechanical angular acceleration sensor can be reduced. A further advantage is that the micromechanical angular acceleration sensor can be produced simply and reliably and cost-effectively and the method for measuring an angular acceleration can be carried out simply and cost-effectively.

In the description, cutout should be understood not just to mean a cutout that merely removes a partial region of the seismic mass, rather cutout should likewise be understood to mean an interspace that is arranged between two mutually separated regions of a seismic mass embodied in multipartite fashion.

Advantageous developments of the features of the disclosure are set forth below.

In accordance with one advantageous development of the disclosure, the seismic mass is embodied integrally or in multipartite fashion. If the seismic mass is embodied integrally, the cutout can be arranged, for example, in the center of the seismic mass, which significantly simplifies the arrangement of the piezoresistive and/or piezoelectric element. In the case of a multipartite embodiment of the seismic mass, the angular acceleration sensor can be adapted to predetermined conditions more simply.

In accordance with a further advantageous development of the disclosure, the at least one suspension is arranged in the cutout. The advantage achieved in this case is that the space requirement for the micromechanical angular acceleration sensor can be reduced even further. At the same time, the suspension is protected against external damage.

In accordance with a further advantageous development of the disclosure, at least one bending beam is arranged which is arranged in a deflectable manner firstly with the at least one suspension and secondly with the substrate. A simple and accurate measurement of the deflection of the seismic mass by means of the piezoresistive and/or piezoelectric element is possible in this way.

In accordance with a further advantageous development of the disclosure, the seismic mass is embodied in ring-shaped fashion. The advantage thus achieved is that overall the seismic mass is embodied symmetrically and can thus be fixed to the substrate by means of a central suspension. A further advantage is that, as a result of the ring-shaped embodiment, the cutout can be formed in the center of the seismic mass in a particularly simple manner.

In accordance with a further advantageous development of the disclosure, a plurality of suspensions and a plurality of bending beams are arranged, wherein at least one bending beam is arranged substantially perpendicularly to a respective suspension. The advantage thus achieved is that a sufficient deformation, in particular compression and/or expansion of the piezoresistive and/or piezoelectric element is thus made possible in a reliable manner. A simple measurement of the deflection and thus of the angular acceleration is thus made possible.

In accordance with a further advantageous development of the disclosure, the at least one bending beam is embodied as a piezoresistive and/or piezoelectric element. The advantage thus achieved is that a complicated arrangement of a piezoresistive and/or piezoelectric element on the bending beam is obviated in this way.

BRIEF DESCRIPTION OF THE DRAWINGS

Exemplary embodiments of the disclosure are illustrated in the drawings and explained in greater detail in the description below.

In the figures.

DETAILED DESCRIPTION

Figure 1:
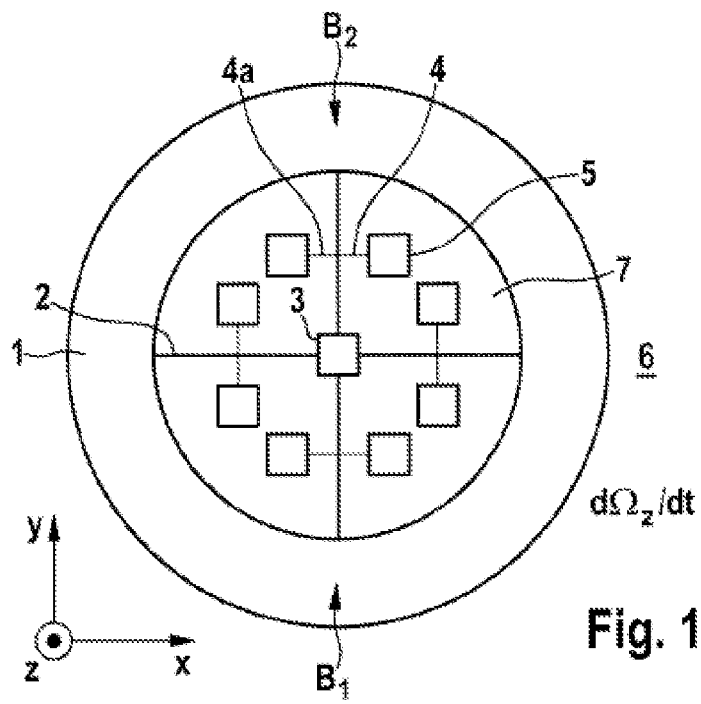
FIG. 1 shows a micromechanical angular acceleration sensor in accordance with a first embodiment of the present disclosure.

FIG. 1 shows a micromechanical angular acceleration sensor in accordance with a first embodiment of the present disclosure.

In FIG. 1, reference sign 1 designates a seismic mass embodied in ring-shaped fashion. The seismic mass 1 is arranged rotatably about a z-axis by means of four suspensions 2, which are each arranged at an angle of substantially 90° with respect to one another, by means of a central suspension 3 arranged at the midpoint of the seismic mass 1, which arranged on a substrate 6. On each of the suspensions 2, bending beams 4a are arranged on the left and right perpendicularly to the respective suspension 2, said bending beams each being provided with a piezoresistive element 4. The respective bending beams 4a on the respective suspension 2 are in each case compressed for example as a result of a deflection of the seismic mass 1 in the clockwise direction about an axis perpendicular to the plane of the drawing and in each case expanded on the opposite side of the respective suspension 2. The bending beams 4a are fixed to the substrate 6 firstly by the respective suspension 2, secondly by means of fixings 5.

On account of the ring shape of the seismic mass 1, a cutout 7 is arranged in the interior of the seismic mass 1, in which cutout the four suspensions 2, the eight bending beams 4a and the respective fixings 5 thereof are arranged on the substrate 6.

Figure 2:
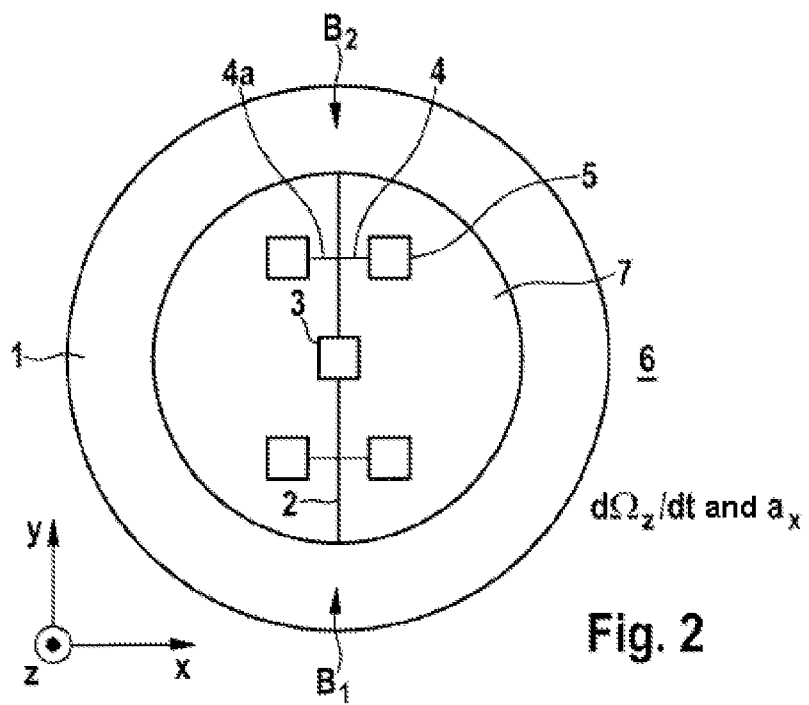
FIG. 2 shows a micromechanical angular acceleration sensor in accordance with a second embodiment of the present disclosure.

FIG. 2 shows a micromechanical angular acceleration sensor in accordance with a second embodiment of the present disclosure.

FIG. 2 substantially shows a micromechanical angular acceleration sensor in accordance with FIG. 1. In contrast to the micromechanical angular acceleration sensor from FIG. 1, the micromechanical angular acceleration sensor in FIG. 2 comprises only two suspensions 2 along a y-axis and thus a total of four bending beams 4a arranged respectively above and below the central suspension 3 of the perpendicularly to the suspension 2 at half the distance between the central suspension 3 and the respective region of the fixing of the suspension to the seismic mass 1.

Figure 3:
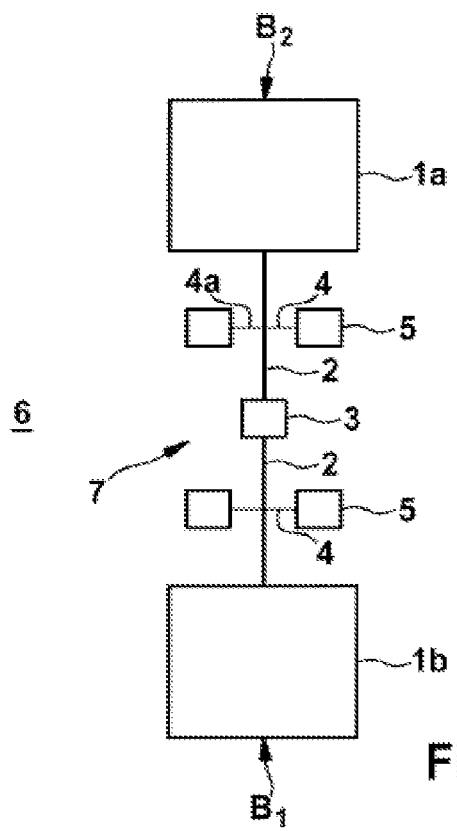
FIG. 3 shows a micromechanical angular acceleration sensor in accordance with a third embodiment of the present disclosure.

FIG. 3 shows a micromechanical angular acceleration sensor in accordance with a third embodiment of the present disclosure.

FIG. 3 substantially shows a micromechanical angular acceleration sensor in accordance with FIG. 2. In contrast to FIG. 2, the seismic mass 1 is not embodied integrally and in ring-shaped fashion but rather is embodied in bipartite fashion, thus resulting in two parts 1a, 1b of the seismic mass. In this case, the respective parts 1a, 1b of the seismic mass 1 are connected to the central suspension 3 by a respective suspension 2. On the respective suspensions 2 connecting the central suspension 3 to the respective seismic mass 1a, 1b, bending beams 4a, provided with piezoresistive elements 4, are arranged as also in FIG. 2 in each case at half the distance between the central suspension 3 and the respective seismic mass 1a, 1b perpendicularly to the respective suspension 2 in each case on opposite sides of the suspension 2. In accordance with FIG. 3, the cutout 7 of the seismic mass 1 is substantially the interspace between the two parts 1a, 1b of the seismic mass 1, in which are arranged the two suspensions 2 of the respective seismic parts 1a, 1b of the seismic mass 1 and also the respective bending beams 4a with piezoresistive elements 4 and the fixings 5 of the bending beams 4 on the substrate 6.

Figure 4:
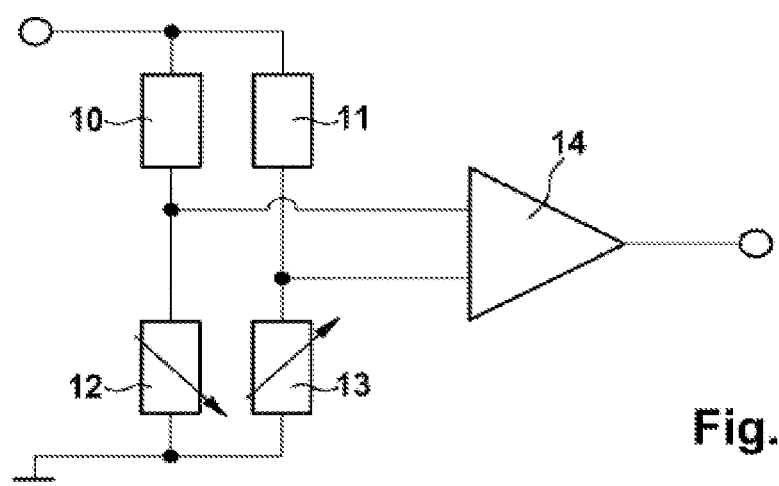
FIG. 4 shows a circuit for evaluating signals of the at least one piezoresistive and/or piezoelectric element.

FIG. 4 shows a circuit for evaluating signals of the at least one piezoresistive and/or piezoelectric element.

FIG. 4 shows a circuit diagram for an evaluation circuit for signals of the piezoresistive elements 4 of the micromechanical angular acceleration sensor in accordance with FIG. 1.

In this case, the evaluation circuit comprises four resistances 10, 11, 12, 13, wherein the resistances 10 and 12, and 11 and 13 are connected in series and the resistances 10, 12 and 11, 13 respectively connected in series are connected in parallel with one another. If one piezoresistive element 4, represented in the form of a resistance 10, 11, 12, 13 in accordance with FIG. 4, is then expanded and the respective opposite piezoresistive element is compressed, the resistance 12 of the corresponding piezoresistive element 4 is reduced, whereas the resistance 13 of the opposite piezoresistive element 4 increases.

If electrical voltages are then tapped off between the piezoresistive elements 10 and 12, on the one hand, and between the piezoresistive elements 11 and 13 on the other hand, and these two voltages are fed to a differential amplifier 14, the voltages are correspondingly amplified and can be fed for further processing for determining the angular acceleration.

Although the present invention has been described above on the basis of preferred exemplary embodiments, it is not restricted thereto, but rather can be modified in diverse ways.

What is claimed is:

1. A micromechanical angular acceleration sensor for measuring an angular acceleration, comprising:
    a substrate;
    a seismic mass defining a cutout;
    at least one suspension directly engaged to the seismic mass and to the substrate in a deflectable manner;
    at least one bending beam engaged to the at least one suspension and to the substrate in a deflectable manner; and
    at least one piezoresistive and/or piezoelectric element configured to measure the angular acceleration,
    wherein the piezoresistive and/or piezoelectric element is arranged in the cutout of the seismic mass.

2. The angular acceleration sensor according to claim 1, wherein the seismic mass is embodied integrally.

3. The angular acceleration sensor according to claim 1, wherein the at least one suspension is arranged in the cutout.

4. The angular acceleration sensor according to claim 1, wherein the at least one piezoresistive and/or piezoelectric element is arranged on the at least one bending beam.

5. The angular acceleration sensor according to claim 1, wherein the seismic mass is configured in ring-shaped fashion.

6. The angular acceleration sensor according to claim 1, wherein:
    the sensor includes (i) a plurality of suspensions that includes the at least one suspension, and (ii) a plurality of bending beams that includes the at least one bending beam, and
    wherein the at least one bending beam is arranged substantially perpendicularly to the at least one suspension.

7. The angular acceleration sensor according to claim 1, wherein the at least one bending beam is configured as a piezoresistive and/or piezoelectric element.

8. The angular acceleration sensor according to claim 1, wherein the seismic mass is embodied in multipartite fashion.

9. The angular acceleration sensor according to claim 1, wherein the at least one bending beam is engaged to the substrate via at least one fixing.

10. The angular acceleration sensor according to claim 1, wherein the at least one suspension is directly engaged to the substrate via at least one central suspension.

11. The angular acceleration sensor according to claim 1, wherein the seismic mass is configured to rotate about an axis defined perpendicular to the substrate.

12. The angular acceleration sensor according to claim 1, wherein the at least one suspension comprises four suspensions arranged at an angle of substantially 90 degrees with respect to each other, each of the four suspensions engaged to the substrate via a central suspension.

13. A method for measuring an angular acceleration, comprising:
    subjecting a seismic mass to a force on account of an angular acceleration, and
    measuring a deflection of the seismic mass on account of the force,
    wherein the deflection is measured by at least one piezoresistive and/or piezoelectric element,
    wherein the at least one piezoresistive and/or piezoelectric element is positioned on at least one bending beam is engaged to at least one suspension and to a substrate in a deflectable manner;
    wherein the at least one suspension is directly engaged to the seismic mass and to the substrate in a deflectable manner; and
    wherein the piezoresistive and/or piezoelectric element is arranged in a cutout of the seismic mass.

14. The method of claim 13, further comprising:
    using the angular acceleration sensor in a motor vehicle for detecting a motor vehicle roll-over and/or in a mobile device.

15. The method of claim 13, further comprising:
    using the deflection measured for positioning a write/read head of a mass storage device of a hard disk of a computer.

16. The method of claim 13, wherein the at least one bending beam is engaged to the substrate via at least one fixing.

17. The method of claim 13, wherein the at least one suspension is directly engaged to the substrate via at least one central suspension.

18. The method of claim 13, wherein the seismic mass is configured to rotate about an axis defined perpendicular to the substrate.

19. The method of claim 13, wherein the at least one suspension comprises four suspensions arranged at an angle of substantially 90 degrees with respect to each other, each of the four suspensions engaged to the substrate via a central suspension.

* * * * *